United States Patent [19]

Teng et al.

[11] Patent Number: 4,963,502
[45] Date of Patent: Oct. 16, 1990

[54] METHOD OF MAKING OXIDE-ISOLATED SOURCE/DRAIN TRANSISTOR

[75] Inventors: Clarence W. Teng, Plano; Thomas E. Tang, Dallas; Che-Chia Wei, Plano, all of Tex.

[73] Assignee: Texas Instruments, Incorporated, Dallas, Tex.

[21] Appl. No.: 416,566

[22] Filed: Oct. 3, 1989

Related U.S. Application Data

[62] Division of Ser. No. 238,978, Aug. 25, 1988.

[51] Int. Cl.[5] .................................. H01L 21/336
[52] U.S. Cl. .............................. 437/41; 437/40; 437/52; 437/56; 437/162; 437/203; 437/228
[58] Field of Search ................. 437/29, 38, 40, 41, 437/52, 56, 57, 162, 203, 228

[56] References Cited

U.S. PATENT DOCUMENTS

| | | | |
|---|---|---|---|
| 4,503,598 | 3/1985 | Vora et al. | 437/203 |
| 4,604,150 | 8/1986 | Lim | 437/162 |
| 4,676,847 | 1/1987 | Lim | 437/162 |
| 4,683,637 | 8/1987 | Varker et al. | 437/40 |

Primary Examiner—Brian E. Hearn
Assistant Examiner—T. Thomas
Attorney, Agent, or Firm—James Comfort; Melvin Sharp; Stanton C. Braden

[57] ABSTRACT

A MOS bulk device having source/drain-contact regions 36 which are almost completely isolated by a dielectric 35. These "source/drain" regions 36 are formed by using a silicon etch to form a recess, lining the etched recess with oxide, and backfilling with polysilicon. A short isotropic oxide etch, followed by a polysilicon filament deposition, then makes contact between the oxide-isolated source/drain-contact regions 36 and the channel region 33 of the active device. Outdiffusion through the small area of this contact will form small diffusions 44 in silicon, which act as the electrically effective source/drain regions. Use of sidewall nitride filaments 30 on the gate permits the silicon etch step to be self-aligned.

7 Claims, 3 Drawing Sheets

METHOD OF MAKING OXIDE-ISOLATED SOURCE/DRAIN TRANSISTOR

This is a division of application Ser. No. 238,978, filed 9/25/88.

BACKGROUND AND SUMMARY OF THE INVENTION

The present invention relates to integrated circuits, and more particularly to CMOS integrated circuits.

In the prior art of bulk CMOS devices, one of the major limitations on scaling the device into smaller sizes is the necessity to avoid latch-up. "Latch-up" is the self-sustaining current flow through the pnpn thyristor defined by a p+ source/drain region, the n-type tank, the p-type well, and an n+ source/drain region. To avoid latch-up, it is necessary to specify minimum separations between p+ and n+ which are many times the minimum geometry of the device; for example, a one micron CMOS device might have five micron or larger n+ to p+ spacing rules. This large spacing is a major limitation on area efficiency of VLSI CMOS integrated circuits.

One way which has been suggested to reduce the spacing requirements of n+ to p+ spacing is to make one or both types of transistors with their active areas in recrystallized polysilicon. However, such devices tend to be quite difficult to manufacture reproducibly. In particular, manufacturing can require many difficult nonstandard steps, and channel mobility may be variable.

A third criterion in development of CMOS devices (besides density and speed) is resistance to single event upset (SEU). That is, integrated circuits will always be exposed to a certain background radiation level, and, as the circuits are scaled to smaller and smaller geometries, many conventional processes have become more sensitive to stray carriers caused by alpha particles. That is, an alpha particle striking a silicon substrate will typically release plural electron-hole pairs, and the fields near the source/drain junctions of active devices may collect enough charge from one such incident to cause reversal of the electrical state of a node, that is an electrical error may be introduced into the logic circuit by the single event upset.

The present invention provides a new device structure and process for making it, and meets needs which were not satisfied by the prior art. In particular, the present invention provides a CMOS device having high speed, low leakage current, high resistance to single event upset, and permits closer spacing of p+ to n+ regions than was permitted in the prior art.

The present invention provides an insulated gate field-effect transistor having a crystalline channel and having sources and drains which are almost completely oxide isolated. These oxide isolated "source/drain" regions are formed by etching a recess in silicon, lining the etched recess with oxide, and backfilling with polysilicon. A short isotropic oxide etch, followed by a polysilicon filament deposition, then makes electrical contact between the oxide-isolated source/drain-contact regions and the channel region of the active device. Use of sidewall nitride filaments on the gate permits the silicon etch step to be self-aligned.

The dopants in these "source/drain" regions will outdiffuse through the small area of contact with crystalline silicon, near the channel area, to form very small diffusions which function electrically as the source/drain regions.[1] Thus, the critical p+ to n+ separation is not defined by the shortest distance between adjacent recessed source/drain regions, but instead is defined by the minimum distance along the path from the small p+ outdiffusion at the edge of the channel region of one transistor, down under the recessed p+ source/drain-contact, underneath the field oxide, underneath the n+ recessed source/drain region, and up to the small n-type outdiffusion at the edge of the channel of an NMOS device. This means that the effective p+ to n+ separation is much larger than that which the circuit designers layout would appear to indicate: in fact, it may even be possible to remove p+ to n+ separation as a separate design rule.

[1] A note regarding terminology; the (mostly) oxide encapsulated heavily doped regions self-aligned to the gate which are taught by preferred embodiments of the present invention occupy almost the same position in the transistor structure (particularly in a horizontal view of the transistor) as the source/drain regions of prior art MOS devices, and these structures are therefore referred to, in quotes, as "source/drain" regions. However, as noted, these "source/drain" regions are not the electrically effective source/drain regions, i.e. majority carriers are not emitted directly from these oxide encapsulated heavily doped regions into the channel: the electrically effective source/drain regions are the relatively small diffusions formed by outdiffusion at the small areas where the oxide-isolated heavily doped polycrystalline regions adjoin crystalline silicon near the channel area. For clarity, the novel "source/drain" structures provided by the present invention will usually be referred to as source/drain-contact regions, but it should be noted that these source/drain-contact regions do not merely serve as contacts, but also can provide conductive diffusions, and/or serve other purposes. Contact is made to the source/drain contact regions in essentially the same ways as contact would be made to source/drain regions of prior art MOS devices.

Another key advantage of the present invention is the resistance to single event upset. Since the source/drain junctions are almost completely oxide isolated, the area per device which is able to collect charge is much smaller. This means that the fraction of single-particle absorptions which occur in a sufficiently favorable location for the generated charge to be collected and disturb the state of an electrical node will be substantially smaller.

Another major advantage of the present invention is improved control of the carrier mobility. Many silicon on insulator technologies form active device channels in deposited and annealed silicon, and consequently suffer from low or irreproducible mobility. Unlike such technologies, the present invention provides devices having their channels in grown bulk silicon which has not been exposed to damage from heavy implanting. Thus, the high mobility and low defect density of grown crystal silicon provide good transistor qualities for the present invention, while still obtaining many of the advantages of silicon-on-insulator devices.

The present invention does provide a device with a fairly sharp curvature on the electrically active source/drain junctions. However, since these diffusions are formed by outdiffusion from a compact source (as opposed to the diffuse source provided, in conventional technology, by the as-implanted source/drain dopants), the divergence of the doping density is larger for a given diffusion length (i.e. the integral of $\sqrt{Dt}$, which is determined by the thermal characteristics of the complete set of processing conditions used) than in the prior art. This naturally produces a graded drain effect. Moreover, if desired, formation of source/drain-contact regions and source/drain diffusions according to the present invention can be combined with a lightly doped drain implant (performed before the gate sidewall filament deposition and silicon recess etch steps). Alternatively, if desired, formation of source/drain-contact regions and source/drain diffusions according to the present invention can be performed using two species of n-type dopants (e.g. both phosphorus and arsenic) to provide a graded doping density due to differential outdiffusion. Thus, yet another advantage of the present invention is that hot-electron effects can be minimized without introducing series resistance into the device electrical characteristics.

Another advantage of the present invention is that an additional extremely heavy channel stop implant can be made into the recess etched for the source/drain-contact regions. This provides further improved isolation.[2] It should be noted that the improved isolation is not merely improved between tanks (i.e. improved isolation between PMOS devices and adjacent NMOS devices), but is also improved between moats (i.e. between NMOS devices and other adjacent NMOS devices). In either case, the spacing between active diffusions in silicon is increased for the same patterned geometries, since the buried oxide which underlies the source/drain-contact regions acts as an extension of the field isolation region. Moreover, as noted, an additional very heavy channel stop implant can be made into the silicon under the buried oxide for improved isolation without any encroachment problems.

[2] Note that this improved isolation is not isotropic: parasitic/leakage current paths which go under the source/drain-contact regions will be better controlled by this additional dose, but those which go in other directions will not. At the side of the gate, where the gate line crosses from the moat (the active device area) onto the field isolation region, the source/drain outdiffusions will extend approximately to the edge of the field isolation region. Thus, parasitic/leakage current paths which begin from the side of the gate will not in general be as well controlled by this additional dose as other leakage paths will be.

The field isolation preferably used for the present invention is not necessarily LOCOS isolation, but could instead be MF$^3$R (SWAMI) or other process which provides field isolation regions having approximately vertical sidewalls. Some of the self-aligned process embodiments of the present invention may produce a conductive ring around the surface of the oxide isolated source/drain-contact regions, and use of an isolation technology which does not produce highly tapered edges to the field isolation region may be desirable to avoid connecting the source/drain-contact regions to substrate at other locations except at the edge of an active device channel. That is, the isotropic oxide etch which permits the source/drain contact regions to contact the silicon near the channel should not be permitted to go deeply enough to permit contact to be made to the silicon underneath the field oxide. If the field isolation technology used is one (like MF$^3$R (SWAMI)) which provides a fairly steep slope at the field oxide to silicon lateral interface, this may not be a significant process constraint, but in other technologies this must be considered. Note also that it is preferable that the isolation technology used should provide field isolation regions which are at least somewhat recessed: for example, direct moat isolation would be substantially less preferable than LOCOS.

A further advantage of the present invention in reducing latch-up susceptibility is that, because most of the area of the source/drain junctions is effectively oxide isolated from the substrate, current regeneration effects (due to a reduction of junction barrier due to charge injection) can only occur at the very small electrically active source/drain area where the oxide isolated source/drain-contact region borders on the channel. That is, this junction in the parasitic thyristor is not only farther removed from the other junctions in the current thyristor, it is also smaller, which further reduces the current gain of the parasitic thyristor, as is desirable. Another way to consider this advantage is that the susceptibility to latch-up is reduced because the effective moat area (active device area) is reduced for a given patterned geometry.

The present invention also has the very important advantage of reduced short channel effects. The junction depth which determines short channel effects in the present invention is determined by the degree of undercut used to connect the oxide-isolated source/drain-contact regions to the bulk silicon, and by the integrated $\sqrt{Dt}$ (i.e. the diffusion length) of the outdiffusion into the bulk silicon. Using the present invention, this depth can be reduced to as little as 0.1 microns, as compared to the typical value of 0.15 to 0.25 microns for otherwise comparable advanced devices. The reduced junction depth permitted by the present invention can reduce various undesirable short channel effects, such as subthreshold leakage, $V_T$ shift, drain induced barrier lowering and current multiplication, and punchthrough. Drain induced barrier lowering and punchthrough are greatly reduced because the embedded oxide layer blocks collection of minority carriers generated by impact ionization near the drain and also reduces the electric field intensity along most of the source/drain boundary area (including both the electrically effective source/drain regions and the source/drain-contact regions).

A further advantage of the present invention is the reduced source/drain sheet resistance. The present invention differs from the prior art in that the depth of the source/drain-contact regions, and the effective junction depth associated with channel conductance, can be independently controlled. That is, sheet resistance of a thin layer is equal to resistivity $\rho$ divided by the film thickness. Since the resistivity of silicon cannot be much increased by doping beyond a certain point, the sheet resistance of source/drain diffusions in the prior art (disregarding any contribution from silicides or self-aligned tungsten or other surface shunting layer) can only be reduced by increasing the depth of the source/drain regions. However, increasing the depth of the source/drain regions has many side effects, and many of them are undesirable. One way of using this advantage is that the depth of the oxide isolated source/drain-contact regions can be increased as compared to conventional CMOS, thereby reducing the source/drain sheet resistance. Moreover, the source/drain-contact regions can be doped to saturation by very heavy implant doses. This means that the sheet resistance of these junctions can be much smaller than for conventional devices of comparable geometries. This means that speed of the device is improved, and that the utility of the source/drain-contact regions as interconnects is improved.

It should be noted that the presently preferred embodiments of the present invention relate to CMOS, but the present invention can also be used for NMOS devices, or even for PMOS devices.

A further advantage of the present invention is that it can be combined with a conventional self-aligned direct-react siliciding process, to silicide the surfaces of the gate and source/drain-contact regions, and/or to provide titanium nitride local interconnects, if desired.

In fact, the present invention is particularly advantageous in connection with processes for silicidation and/or local interconnect which create a surface layer which is able to absorb dopants from silicon. (For example, this is a potential problem with direct-react TiSi$_2$/-

TiN silicidation/local interconnect processes.) In conventional use of processes of this type, this absorption of dopants (together with consumption of silicon by the silicidation reaction) will make the source/drain diffusions more shallow, and may even make them so shallow that spiking (i.e. shorting from the contacts to the underlying substrate) occurs. Another potential problem with conventional processes of this type is contact resistance: if the silicide depletes source/drain dopants excessively, it can become difficult to form an ohmic contact with a low specific contact resistance. Another potential problem with conventional processes of this type is hot electron generation at the silicide corner nearest the gate, if too much of the voltage drop appears here. In embodiments of the present invention, since the depth of the source/drain-contact region can be made much greater than the depth of a conventional source/drain diffusion of comparable minimum lateral dimension, a larger total dose of dopants can be used at the source/drain implanting stage, to resist dopant depletion. Moreover, since the diffusivity of polysilicon is much higher than that of crystalline silicon, the dopant concentration will more readily equilibrate within the source/drain-contact region, so that the local depletion effects which can lead to high contact resistance are also avoided. Thus, the present invention, when combined with processes for silicidation and/or local interconnect which create a surface layer which is able to absorb dopants from silicon, provides advantages of improved resistance to spiking, improved specific contact resistance, and improved resistance to hot carrier effects.

Yet another advantage of the present invention is that the parasitic capacitance of the source/drain-contact regions will (for a given geometry and depth) be less than that of the source/drain regions used in the prior art. This reduction in parasitic capacitance will often translate directly into greater speed for the electrical circuits including devices according to the present invention.

In a further class of alternative embodiments of the invention, the oxide isolated source/drain-contact regions are not made of polysilicon at all, but are made of metal. That is, after the oxide-isolated recesses are formed, metal is deposited (preferably conformally) and planarized to fill the surface of the source/drain-contact recess. The oxide is then undercut, and conformal polysilicon deposition performed to electrically connect the oxide-isolated source/drain-contact regions to the substrate.

According to the present invention there is provided: A process for fabricating integrated circuits, comprising the steps of: providing a substrate having a monocrystalline upper portion: providing field isolation regions in predetermined locations in monocrystalline upper portion to define active device locations therebetween: forming insulated gate lines over predetermined locations including predetermined portions of said active device areas, said insulated gate lines defining transistor channels in portions of said active device areas; forming sidewall filaments on said gate lines; etching, to approximately a predetermined depth, areas of said monocrystalline upper portion of said silicon that are not covered by said gate lines, by said field isolation, nor by said sidewall filaments on said gate lines, to form a source/drain-contact recess: forming a dielectric conformally on bottoms and sidewalls of said recess: filling said source/drain-contact recesses with a conductive material; etching back said conformally formed dielectric from around said source/drain-contact recesses to produce a groove surrounding the surface of said source/drain-contact recesses, and refilling said groove with a filament of conductive material: and heating said substrate to cause outdiffusion of dopants from said isolated source/drain-contact regions, to create a plurality of source/drain diffusions connecting said source/drain contact regions to corresponding ones of said transistor channel regions.

According to the present invention there is also provided: An integrated circuit including insulated gate field effect transistor active devices, comprising: a substrate having a monocrystalline silicon upper portion: field isolation regions surrounding and defining a plurality of active device regions: a plurality of conductive gate lines crossing over said active device regions in predetermined locations to define transistor channels thereunder, said gate lines being insulated from said transistor channels; a plurality of source/drain-contact regions each comprising a body of conductive material recessed into said substrate and partially isolated therefrom by a conformal dielectric layer: wherein some upper portions of said source/drain-contact regions are connected to said substrate at locations adjacent to said channel region also containing source/drain outdiffusions therein connecting ones of said source/drain-contact regions to adjacent ones of said channel regions.

BRIEF DESCRIPTION OF THE DRAWINGS

The present invention will be described with reference to the accompanying drawings, wherein.

DESCRIPTION OF THE PREFERRED EMBODIMENTS

Figure 1:
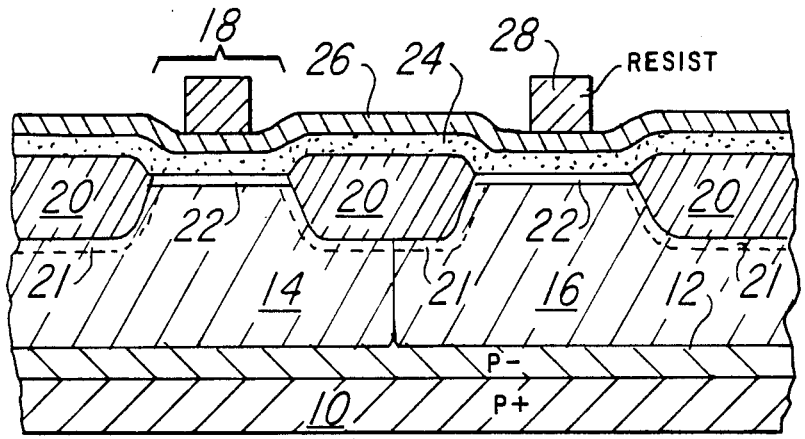
FIGS. 1, 2, 3, 4, 5A (with 5B), 6, and 7 show sequential stages in a sample fabrication process as taught by the present invention.

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

A sample process flow for making an MOS device will now be described. This sample process flow uses MF$^3$R (SWAMI) field isolation technology, but, as discussed above, other isolation technologies could be used instead.

In an epitaxial silicon wafer having a p− epitaxial layer 12 over a p+ substrate 10, dopants are implanted and driven in to produce n-wells 14 and p-wells 16. A nitride/oxide dielectric is patterned and etched to cover only the active device regions 18 (also known as "moat" regions).

Of course, the substrate does not have to be epitaxial, nor does it have to be strictly silicon, as long as it has a crystalline semiconductor surface portion: SOI structures, where a crystalline semiconductor surface portion is fully isolated by a buried dielectric layer, could be used instead. Silicon/germanium structures, or other semiconductors, could less preferably be used instead of silicon.

Similarly, the CMOS well structure does not have to be a "twin-tub" process as described here (i.e. a process where both n-wells (PMOS device regions) and p-wells (NMOS device regions) are separately doped by implantation), but less preferably other well structures could be used instead.

The process flow deviates from LOCOS isolation techniques slightly at this point: while the photoresist used to pattern the nitride is still in place, after the oxide/nitride etch has stopped on silicon, a silicon etch is then performed, so that the substrate (more precisely the p-epitaxial layer 12) is etched away to a depth of, e.g., 2000 Å. Another nitride deposition, followed by a short etchback, is then performed to leave a nitride layer on the sidewalls (only) of the silicon recesses just etched. These additional steps will reduce lateral encroachment when the field oxide 20 is grown, and will also cause the field oxide to be recessed more than it would be otherwise.

As discussed elsewhere in this application, other field isolation technologies could be used instead. The field isolation dielectric 20 does not strictly have to be an oxide, although this is preferable.

While this same photoresist mask is in place, a channel stop implant is performed, e.g. $3E12$ $cm^{-2}$ of boron at 100 keV as a blanket implant. This additional implant dose increases the threshold of the thick-field parasitic transistor, to help prevent leakage under the field oxide 20.

The field oxide 20 is now grown, e.g. at 900 C. in steam to a thickness of 8000 Å.

Next, after a dummy gate oxide is grown and stripped, the gate oxide 22 is grown, e.g. at 950 C. in $O_2$+HCl to a thickness of 250 Å. The polysilicon layer 24 is then deposited (e.g. 4500 Å thick) and doped (e.g. by POCl$_3$ doping). A protective layer 26 (e.g. 2000 Å of TEOS oxide, but alternatively there may be advantages to using nitride or a nitride/oxide layer structure for this layer) is deposited over the polysilicon layer 24, to protect it from later etch steps. A resist layer 28 is then patterned to define the predetermined pattern for the polysilicon layer 24 (which will provide not only gates but also gate-level interconnects). This produces the structure shown in FIG. 1.

Less preferably, other gate dielectric structures could be used instead to configure an insulated-gate field-effect transistor, including layered dielectrics and dielectrics which include dielectrics other than silicon dioxide.

Less preferably, the polysilicon layer 24 does not have to be strictly polycrystalline silicon: this layer could be configured as a layered structure and/or could include metal silicides or refractory metals.

The oxide (or nitride) layer 26 is now etched, and this etch step is followed by a silicon etch step while the resist 28 is still in place, to etch the polysilicon layer 24 to the desired pattern. Optionally, a reachthrough implant may be performed at this point (e.g. $1E13$ $cm^{-2}$ of phosphorus at 80 keV, with photoresist patterned to expose the NMOS areas only) to provide lightly doped drain ("LDD") regions for the NMOS devices.

Figure 2:
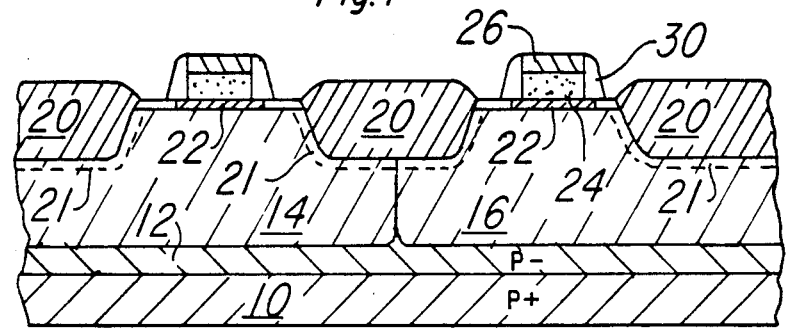

Nitride sidewalls 30 are now formed on the polysilicon layer 24, e.g. by conformally (LPCVD) depositing 2000 Å of nitride and etching back to leave filaments. This produces the structure of FIG. 2. The sidewalls 30 do not strictly have to consist essentially of silicon nitride, although silicon nitride is particularly advantageous in protecting the integrity of the gate dielectric against subsequent oxidation steps. Other non-siliconoxide dielectrics could be used, or (less preferably) these filaments could simply be made of oxide instead.

Exposed silicon is now etched, e.g. to a depth of 5000 Å. Note that this is preferably an unpatterned etch, since the field oxide 20, the protective layer 26, and the sidewall nitride filament 20 leave exposed silicon only in desired locations of source/drain-contact regions. This self-aligned etch will etch recesses 32 which are close to the channel regions 33.

The depth of this etch is not critical. It is preferable that the source/drain-contact regions have a depth which is more than ⅔ of the thickness of the field isolation regions 20, but this is not essential. Making the source/-drain-contact regions thicker will increase the etch time required for this step, but will not otherwise significantly degrade processing; making them thinner will shorten the p+ to n+ path and reduce some of the other advantages of the invention. It is also preferable that the source/drain-contact regions have a depth which is more than twice the depth of the grooves 38. Some advantages of the present invention would still be preserved if these depth relations are not observed, but such embodiments are less preferable.

After the silicon etch, a dielectric 35 (preferably an oxide) is formed lining the silicon recesses 32—e.g., 250 Å of oxide is grown and then 1500 Å oxide is deposited. Growing the 250 Å before depositing the rest provides a better quality interface. Alternatively, if a grown dielectric is preferred here, all 1500 Å could be grown. Note that if a deposited rather than a grown dielectric is used at this step (as in this example), the sidewall dielectric filaments 30 need not be made of an oxidation-resistant dielectric, e.g. they can be made of oxide rather than nitride.

Figure 3:
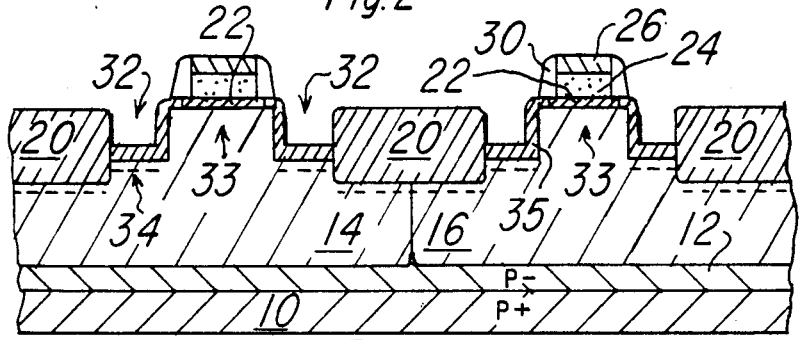

An additional channel stop implant can optionally be performed at this point to provide channel stop regions 34 underneath the source/drain-contact regions 36 (in addition to the previously formed channel stop regions 21 under field oxide 20). For example, $2E12$ $cm^{-2}$ of boron at 100 keV could be implanted as a blanket implant. Alternatively, using an additional mask to expose only the NMOS devices to this implant, a heavier implant, such as $1E13$ $cm^{-2}$ of boron at 100 keV could be used. This produces the structure shown in FIG. 3.

Figure 4:
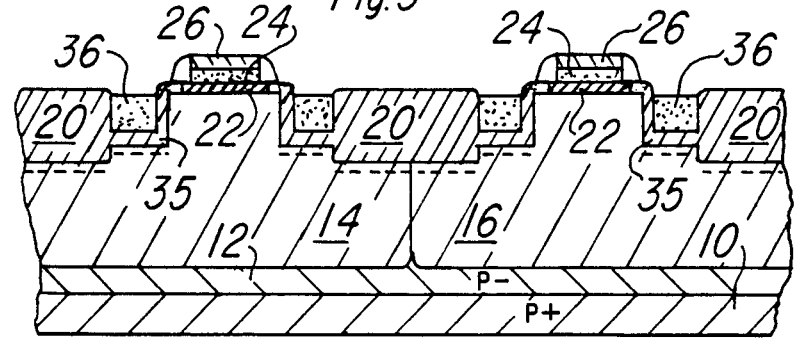

The recesses 32 are now refilled, e.g. by conformal deposition of 5000 Å of amorphous silicon followed by resist etchback planarization, so that the surfaces of the source/drain-contact regions 36 are substantially coplanar with the gate oxide 22. (Polysilicon could be used instead of amorphous silicon for the refill step.) This step results in the structure shown in FIG. 4.

One class of alternative embodiments does not planarize the regions 36 back to the original surface level: that is, alternatively, the silicon deposition and etchback depths are changed so that the surfaces of the source/drain-contact regions are higher than the gate oxide 22. This embodiment has the advantage that, in some processes, the grooves 38 which surround the source/drain-contact regions have a reduced risk of contacting the substrate near the edge of field oxide 20. (Of course, the oxide etchback step which etches back the dielectric 35 must be continued long enough to permit contact (and interdiffusion) between the regions 36 and the silicon near the channel 33.) For example, if the field oxide 20 is a LOCOS oxide, it may have an upper surface which is more sloped than the surface of the sidewall filament 30, so that the length of dielectric 35 which would have to be isotropically etched away to expose substrate near field oxide 20 is greater than the length of dielectric 35 which would have to be etched away to expose substrate near gate 24. Moreover, the field oxide 20 may load the oxide etch, so that the dielectric 35 is actually eroded more rapidly near the gate 24 than near the field oxide 20.

In another distinct class of alternative embodiments, the recesses 32 are refilled with metal rather than silicon. For example, chemical vapor deposition of 5000 Å followed by resist-etchback planarization could be done at this stage.

Figure 5A:
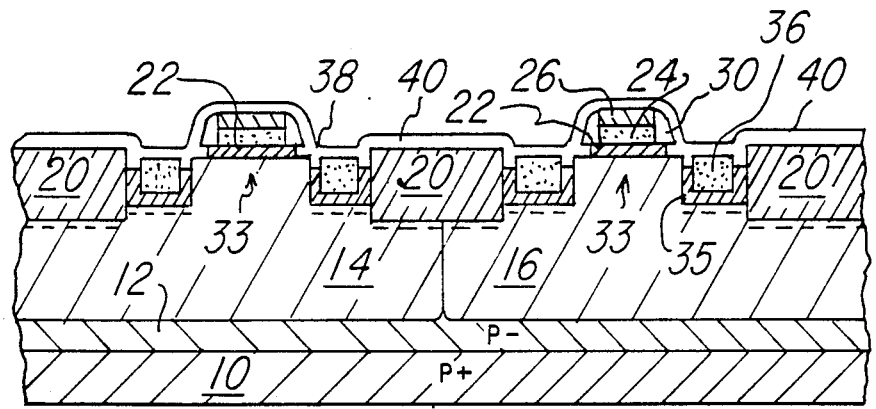
Figure 5B:
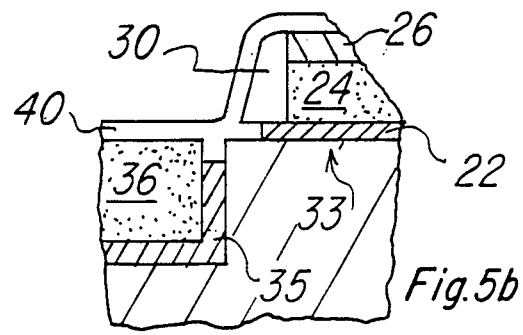

An oxide etching step is now used to etch back the dielectric 35 which lines the source/drain-contact recesses 32, to produce grooves 38 around the edge of the source/drain-contact regions 36. This etching step is preferably a short wet etch, e.g. in 10% HF. A thin layer of polysilicon (or alternatively amorphous silicon) 40 is now deposited conformally, to refill the grooves 38. This produces the structure shown in FIG. 5A. FIG. 5B is an expanded view of the portion of this structure near the boundary between the gate 24 and the source/drain-contact region 36.

Figure 6:
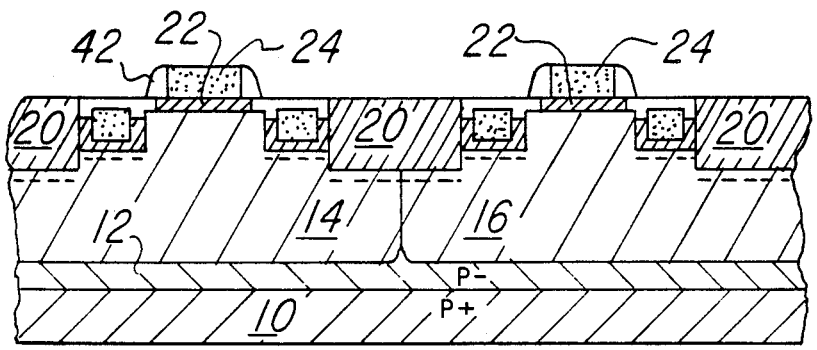

The thin silicon layer 40 is now etched back, to leave silicon only in the grooves 38. (This is preferably done by a short wet etch, e.g. with pyrocatechol or aqueous KOH, but could be done as a plasma etch instead.) The nitride sidewalls 30 are removed, e.g. by wet etching in $H_3PO_4$. (This is done to improve reliability, but, less preferably, these nitride sidewalls could be left in place.) Oxide sidewalls 42 are preferably now formed, to improve topography, to prevent shorts from the gate to the source/drain regions if siliciding is used, and to screen the ensuing source/drain doping implant. This produces the structure shown in FIG. 6. Note that, by varying the deposition and etchback thicknesses, these oxide sidewalls 42 can be made narrower than the nitride sidewalls 30 which defined the location of the source/drain-contact regions 36. If this is done, then part of the implant which dopes the source/drain-contact regions 36 will also hit the silicon between the source/drain-contact regions 36 and the gate 24: this means that, by reducing the width of these filaments 42, the doping concentration of the electrically effective source/drain regions 44 can be increased, and the doping profile of the electrically effective source/drain regions 44 can be adjusted. This may optionally be useful in refining the tradeoff between avoiding hot-carrier effects and reducing series resistance. However, to improve manufacturing control and avoid degrading the resistance to punch-through, it is most preferable to make the sidewall filament 42 sufficiently wide that this heavy implant does not introduce a large concentration of of dopants into the substrate.

Figure 7:
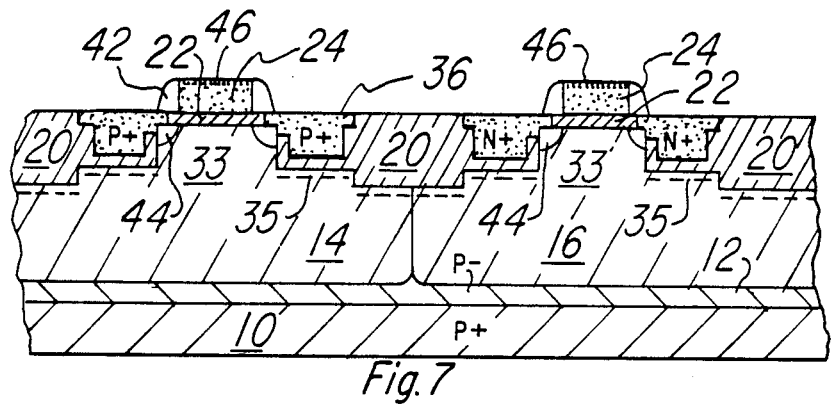

Next, p+ and n+ source/drain dopants are introduced, e.g. by using two masked implants. $3E15$ cm$^{-2}$ of arsenic at 150 keV into the NMOS device areas and $5E15$ cm$^{-2}$ of boron at an equivalent energy of 20 keV into the PMOS areas. These implants dope the source/drain-contact regions 36, and a subsequent anneal (e.g. 65 minutes in argon at 900 C.) causes outdiffusion of dopants to dope the silicon in the grooves 38 and to form the electrically effective source/drain regions 44. If desired, self-aligned silicide regions can be formed on all exposed silicon areas (namely the source/drain-contact regions 36 and the gates 24) by known methods (e.g. deposit 2000 Å of Ti overall, heat in a nitrogen atmosphere to 675 C. to induce the silicidation reaction, pattern and etch the titanium which was not over silicon (which will have formed a nitrogen-containing compound) to define local interconnects), and heat to 800 C. to anneal the silicides and lower their sheet resistance. (Note that, since the source-drain contact regions are deeper than conventional source/drain diffusions, they can hold a larger total dose of dopants, and depletion of dopants by segregation into the silicide is much less of a problem.) The foregoing steps result in the structure of FIG. 7.

Processing concludes with conventional steps, e.g. deposition of an interlevel dielectric, etching contact holes, deposition and etching of metal, and deposition and etching of protective overcoat.

Figure 8:
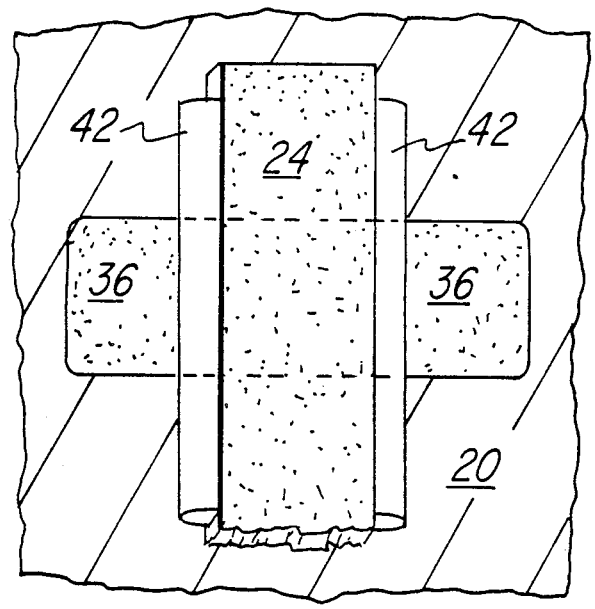
FIG. 8 shows a plan view of portions of a sample device structure according to the present invention.

FIG. 8 shows a sample plan view of a finished structure according to the present invention.

As will be appreciated by those skilled in the art, the present invention can be widely modified and varied, and its scope is not limited except as specified in the allowed claims.

SUMMARY OF TECHNICAL ADVANTAGES

The advantages of the present invention include, in addition to others described in the present application, at least the following:
1. The susceptibility to latch-up is reduced, since the effective p+ to n+ separation is much larger than that which the circuit designers' layout would appear to indicate: in fact, it may be possible to remove p+ to n+ separation as a separate design rule.
2. Resistance to single event upset is improved.
3. Excellent control of carrier mobility is achieved.
4. Hot-electron effects can be minimized without introducing series resistance into the device electrical characteristics.
5. Isolation is optionally improved by an additional channel stop implant into the substrate directly beneath the source/drain-contact regions. It should be noted that the improved isolation is not merely improved between tanks (i.e. improved isolation between PMOS devices and adjacent NMOS devices), but is also improved between moats (i.e. between NMOS devices and other adjacent NMOS devices).
6. The present invention can be used with a variety of field isolation technologies, including LOCOS, MF$^3$R (SWAMI), or other technologies.
7. Latch-up susceptibility is further reduced by limiting current regeneration effects to a small area.
8. Short channel effects are reduced.
9. Better diffused interconnects are possible, since the sheet resistance of the "source/drain" regions is less than in the prior art.
10. Conventional self-aligned direct-react siliciding processes, or direct-react metal-cladding processes, can be used in combination with the present invention.
11. The parasitic capacitance of the source/drain regions is reduced. This will permit greater speed in circuits including devices according to the present invention.
12. The present invention, when combined with processes for silicidation and/or local interconnect which create a surface layer which is able to absorb dopants from silicon, provides the advantage of improved resistance to junction spiking.
13. The present invention, when combined with processes for silicidation and/or local interconnect which create a surface layer which is able to absorb dopants from silicon, provides the advantage of improved specific contact resistance.

14. The present invention, when combined with processes for silicidation and/or local interconnect which create a surface layer which is able to absorb dopants from silicon, provides the advantage of improved resistance to hot carrier effects.

What is claimed is:

1. A process for fabricating integrated circuits, comprising the steps of:
   (a) providing a substrate having a monocrystalline upper portion:
   (b) providing field isolation regions in predetermined locations in monocrystalline upper portion to define active device locations therebetween:
   (c) forming insulated gate lines over predetermined locations including predetermined portions of said active device areas, said insulated gate lines defining transistor channels in portions of said active device areas:
   (d) forming sidewall filaments on said gate lines:
   (e) etching, to approximately a predetermined depth, areas of said monocrystalline upper portion of said silicon that are not covered by said gate lines, by said field isolation, nor by said sidewall filaments on said gate lines, to form a source/drain-contact recess:
   (f) forming a dielectric conformally on bottoms and sidewalls of said recess:
   (g) filling said source/drain-contact recesses with a conductive material:
   (h) etching back said conformally formed dielectric from around said source/drain-contact recesses to produce a groove surrounding the surface of said source/drain-contact recesses, and refilling said groove with a filament of conductive material; and
   (i) heating said substrate to cause outdiffusion of dopants from said isolated source/drain-contact regions, to create a plurality of source/drain diffusions connecting said source/drain contact regions to corresponding ones of said transistor channel regions.

2. The process of claim 1, wherein said active device regions comprise both NMOS and PMOS active regions, and
   (g) wherein said step of filling said isolated source/drain-contact recesses with conductive material uses a very lightly doped conductive material; and further comprising the subsequent step of
   (i) introducing a p-type dopant to said source/drain-contact regions in said PMOS active device regions and an n-type dopant to said source/drain-contact regions in said NMOS active device regions.

3. The method of claim 1, wherein said step (c) of forming gate lines initially provides a conductive portion consisting predominantly of polysilicon and overlain by a protective dielectric layer.

4. The method of claim 1, wherein said step (c) of forming gate lines initially provides a conductive portion consisting predominantly of a polysilicon/silicide sandwich structure and overlain by a protective dielectric layer.

5. The process of the preceding claim, wherein said protective dielectric comprises silicon nitride, whereby said protective dielectric is not removed during said step of isotropically etching back said dielectric surrounding said isolated source/drain-contact regions, and wherein said dielectric surrounding said isolated source/drain-contact regions consists predominantly of silicon oxides.

6. The process of claim 1, wherein said step (g) of filling said source/drain-contact recesses fills them with metal.

7. The process of the preceding claim, wherein said metal is selected from the group consisting of tungsten, molybdenum, tantalum, niobium, columbium, palladium, and platinum-group metals.

* * * * *